United States Patent
Lei et al.

(10) Patent No.: US 10,734,768 B2
(45) Date of Patent: Aug. 4, 2020

(54) DATA COMMUNICATION CABLE ASSEMBLY INCLUDING ELECTROMAGNETIC SHIELDING FEATURES

(71) Applicant: Cosemi Technologies, Inc., Irvine, CA (US)

(72) Inventors: HaiBin Lei, Shanghai (CN); JianKai Gu, Jiangsu (CN); Atul Sharma, Frisco, TX (US)

(73) Assignee: Cosemi Technologies, Inc., Irvine, CA (US)

(*) Notice: Subject to any disclaimer, the term of this patent is extended or adjusted under 35 U.S.C. 154(b) by 0 days.

(21) Appl. No.: 15/981,009

(22) Filed: May 16, 2018

(65) Prior Publication Data

US 2019/0356090 A1 Nov. 21, 2019

(51) Int. Cl.
*H01R 13/52* (2006.01)
*H01R 13/6593* (2011.01)
(Continued)

(52) U.S. Cl.
CPC ..... *H01R 13/6593* (2013.01); *H01B 11/1813* (2013.01); *H01B 11/22* (2013.01);
(Continued)

(58) Field of Classification Search
CPC ............ H01R 13/6592; H01R 13/6587; H01R 13/6582; H01R 13/6581; H01R 13/6593;
(Continued)

(56) References Cited

U.S. PATENT DOCUMENTS 3,622,952 A    11/1971  Hilbert
3,721,869 A *  3/1973   Paoli ................. H01R 13/7197
                                                            333/183

(Continued)

FOREIGN PATENT DOCUMENTS

EP         1978656       8/2008
JP        200955306      3/2009
(Continued)

OTHER PUBLICATIONS http://www.ophit.com/products/product_view.asp?boardid=1&num=6&ptitle=DVI%20fiber%20optic%20cable%20:%20ddi.
(Continued)

*Primary Examiner* — Abdullah A Riyami
*Assistant Examiner* — Justin M Kratt
(74) *Attorney, Agent, or Firm* — Loza & Loza LLP; George Fountain

(57) ABSTRACT

A data communication cable assembly including a cable with wire and/or optical fiber communication mediums for transmitting data signals and/or power signals, and connectors for connecting to a pair of devices, respectively. Each of the connector includes a connector plug or receptacle configured to mate with a corresponding receptacle or plug of a device, wherein the connector plug or receptacle includes a set of electrical contacts configured to send and/or receive the data signals and/or power signals to and/or from the device; a metallic shell defining an enclosure and including first and second openings, wherein the connector plug or receptacle mate is configured to mate with the corresponding receptacle or plug of the device via the first opening, and wherein the cable extends from inside to outside of the enclosure via the second opening; and electrically-conductive filler material configured to reduce electromagnetic leakage via the first and second openings.

23 Claims, 5 Drawing Sheets

(51) Int. Cl.
| | |
|---|---|
| *H01R 13/58* | (2006.01) |
| *H01R 13/66* | (2006.01) |
| *H01B 11/22* | (2006.01) |
| *H01B 11/18* | (2006.01) |
| *H01R 13/506* | (2006.01) |
| *H01B 7/18* | (2006.01) |
| *H01R 33/965* | (2006.01) |
| *H01R 13/6594* | (2011.01) |
| *H01R 43/00* | (2006.01) |
| *H01R 31/06* | (2006.01) |
| *H01R 33/94* | (2006.01) |
| *G02B 6/24* | (2006.01) |
| *H01R 25/00* | (2006.01) |
| *H01R 13/24* | (2006.01) |
| *H01R 33/88* | (2006.01) |
| *H01R 13/6584* | (2011.01) |
| *H01R 24/54* | (2011.01) |

(52) U.S. Cl.
CPC ......... *H01R 13/506* (2013.01); *H01R 13/582* (2013.01); *H01R 13/6691* (2013.01); *G02B 6/24* (2013.01); *H01B 7/1815* (2013.01); *H01R 13/2414* (2013.01); *H01R 13/5205* (2013.01); *H01R 13/5219* (2013.01); *H01R 13/5221* (2013.01); *H01R 13/6584* (2013.01); *H01R 13/6594* (2013.01); *H01R 24/54* (2013.01); *H01R 25/00* (2013.01); *H01R 31/06* (2013.01); *H01R 33/88* (2013.01); *H01R 33/94* (2013.01); *H01R 33/965* (2013.01); *H01R 43/007* (2013.01); *H05K 2201/10121* (2013.01)

(58) Field of Classification Search
CPC ............ H01R 13/5205; H01R 13/5219; H01R 13/5221; H01R 33/965; H01R 13/6584; H01R 13/6594; H01R 24/54; H01R 43/007; G02B 6/24; H05K 2201/10121
USPC ............ 439/607.41, 607.42, 607.46, 607.55, 439/607.53, 607.2, 607.18, 86, 87, 89, 439/271, 577, 385
See application file for complete search history.

(56) References Cited

U.S. PATENT DOCUMENTS

| | | | |
|---|---|---|---|
| 4,451,916 A | 5/1984 | Casper et al. | |
| 4,585,292 A * | 4/1986 | Frantz | H01R 9/032 439/607.47 |
| 4,990,106 A * | 2/1991 | Szegda | H01R 9/0518 439/585 |
| 5,587,884 A * | 12/1996 | Raman | H01R 13/665 333/182 |
| 5,966,387 A | 10/1999 | Cloutier | |
| 6,931,183 B2 | 8/2005 | Panak et al. | |
| 6,940,477 B2 | 9/2005 | Moon et al. | |
| 7,155,134 B2 | 12/2006 | Azadet | |
| 7,551,852 B2 | 6/2009 | Reintjes et al. | |
| 7,602,739 B2 | 10/2009 | Weigert | |
| 7,706,692 B2 | 4/2010 | Tatum et al. | |
| 7,714,677 B2 | 5/2010 | Wang | |
| 7,734,183 B2 | 6/2010 | Whitehead | |
| 7,941,052 B2 | 5/2011 | Epitaux et al. | |
| 8,068,742 B2 | 11/2011 | Cole et al. | |
| 8,233,805 B2 | 7/2012 | Tatum et al. | |
| 8,251,594 B2 | 8/2012 | Lavoie et al. | |
| 8,804,792 B1 | 8/2014 | Cheung et al. | |
| 8,805,195 B2 | 8/2014 | Mateosky et al. | |
| 8,824,898 B2 | 9/2014 | Groepl et al. | |
| 8,831,436 B2 | 9/2014 | Evans et al. | |
| 8,935,740 B2 | 1/2015 | Suzuki et al. | |
| 8,948,197 B2 | 2/2015 | Jiang et al. | |
| 9,040,823 B2 | 5/2015 | Horan et al. | |
| 9,076,575 B2 | 7/2015 | Horan et al. | |
| 9,397,750 B2 | 7/2016 | Parekh et al. | |
| 9,397,751 B2 | 7/2016 | Parekh et al. | |
| 9,602,116 B1 | 3/2017 | Le et al. | |
| 9,813,153 B2 | 11/2017 | Parekh et al. | |
| 2002/0126967 A1 | 9/2002 | Panak et al. | |
| 2003/0129872 A1* | 7/2003 | Tolmie | G02B 6/3817 439/577 |
| 2003/0132941 A1 | 7/2003 | Echizenya | |
| 2004/0056732 A1 | 3/2004 | Errington | |
| 2004/0070411 A1 | 4/2004 | Self et al. | |
| 2004/0184746 A1 | 9/2004 | Chang et al. | |
| 2006/0024067 A1 | 2/2006 | Koontz | |
| 2006/0221948 A1 | 10/2006 | Benner et al. | |
| 2006/0268167 A1 | 11/2006 | Cole et al. | |
| 2007/0014522 A1 | 1/2007 | Yamaguchi et al. | |
| 2007/0237463 A1 | 10/2007 | Aronson | |
| 2007/0237470 A1 | 10/2007 | Aronson et al. | |
| 2007/0286600 A1 | 12/2007 | Guo et al. | |
| 2008/0031629 A1 | 2/2008 | Nguyen et al. | |
| 2008/0107424 A1 | 5/2008 | Tonietto et al. | |
| 2009/0009662 A1 | 1/2009 | Manapragada et al. | |
| 2009/0060425 A1* | 3/2009 | Aronson | G02B 6/4292 385/88 |
| 2009/0260043 A1 | 10/2009 | Tatsuta et al. | |
| 2009/0269013 A1 | 10/2009 | Durand et al. | |
| 2010/0150573 A1 | 6/2010 | Furuyama | |
| 2010/0284323 A1 | 11/2010 | Tang et al. | |
| 2011/0091219 A1 | 4/2011 | Tatum et al. | |
| 2011/0111642 A1 | 5/2011 | Sloey et al. | |
| 2012/0249871 A1 | 10/2012 | Nguyen et al. | |
| 2013/0147520 A1 | 6/2013 | Payne | |
| 2013/0243437 A1 | 9/2013 | Kishima et al. | |
| 2014/0346325 A1 | 11/2014 | Frank | |
| 2015/0110499 A1 | 4/2015 | Jiang et al. | |
| 2015/0171561 A1* | 6/2015 | Little | H01R 24/60 439/607.34 |
| 2015/0295647 A1 | 10/2015 | Parekh et al. | |
| 2016/0079714 A1* | 3/2016 | Wu | H01R 13/6585 439/607.05 |
| 2016/0240982 A1 | 8/2016 | Ohkubo et al. | |
| 2017/0054501 A9 | 2/2017 | Jiang et al. | |

FOREIGN PATENT DOCUMENTS

| | | |
|---|---|---|
| JP | 201124179 | 12/2011 |
| WO | 2008119669 | 10/2008 |
| WO | 2012059071 | 10/2012 |

OTHER PUBLICATIONS https://web.archive.org/web/20080611135155/http://www.ophit.com/html/main02-01-05.asp.
PCT/US12/57520. Int'l Search Report & Written Opinion (dated Feb. 1, 2013).
PCT/US12/57520. Int'l Prelim. Report of Patentability (dated Apr. 1, 2014).
PCT/US14/045310. Int'l Search Report & Written Opinion (dated Nov. 5, 2014).
Chinese Patent Application No. 201480038089.9, First Office Action dated Oct. 28, 2016.
Japanese Office Action for Japanese Application No. 2016-524354 dated Mar. 28, 2018, 3 pages.
International Search Report for International Application No. PCT/US19/26858, dated Jun. 27, 2019, 12 pages.

* cited by examiner

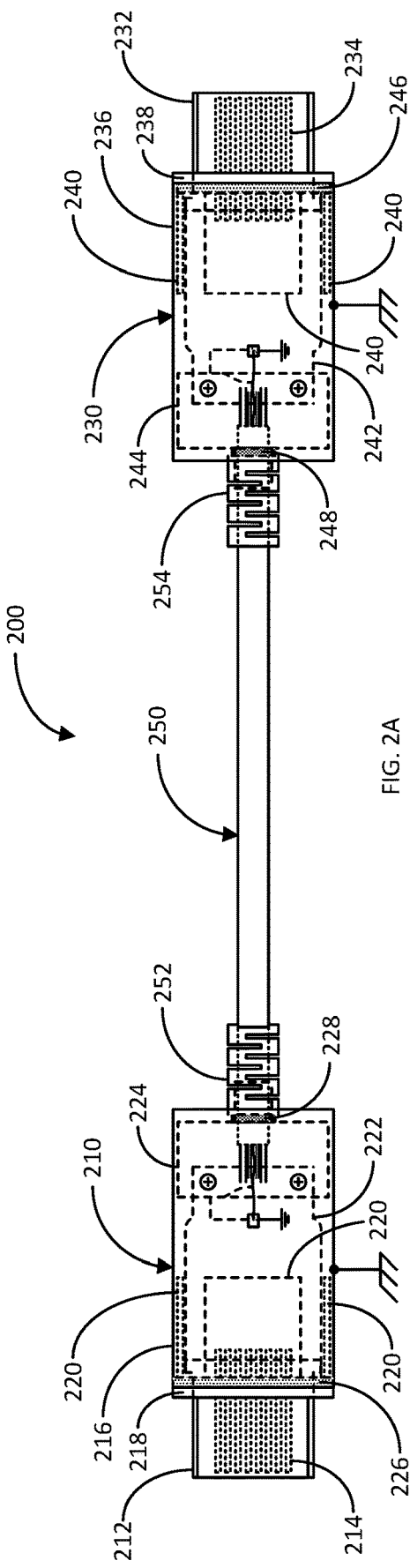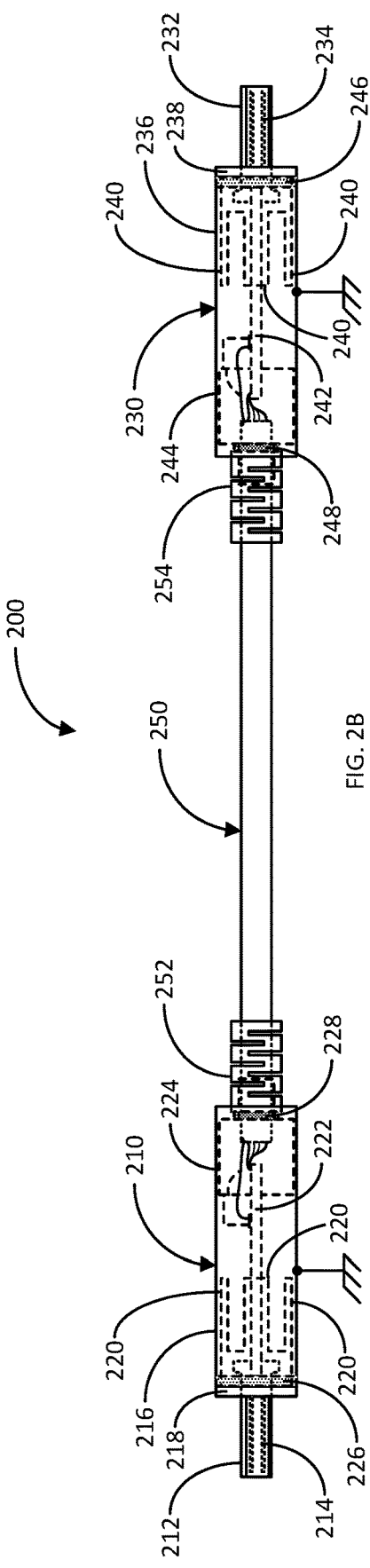
FIG. 2A
FIG. 2B

DATA COMMUNICATION CABLE ASSEMBLY INCLUDING ELECTROMAGNETIC SHIELDING FEATURES

BACKGROUND

Field

Aspects of the present disclosure relate generally to data communication cables, and in particular, to a data communications cable assembly including electromagnetic shielding features.

Background

A data communication cable is often used to communicate data signals from a first device to a second device, from the second device to the first device, or in both directions. In many cases, the data rate of the data signals is sufficiently high that it produces significant electromagnetic leakage in undesired frequency spectrum, which may adversely interfere with other devices. Because of the potential for adverse electromagnetic leakage, many standards or protocols provide requirements for the maximum allowable electromagnetic leakage of a cable. Thus, this disclosure relates to reducing electromagnetic leakage from data communication cables.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to a data communication cable assembly including a cable with a set of one or more communication mediums for transmitting one or more data signals and/or one or more power signals; a first connector attached to a first end of the cable; and a second connector attached to a second end of the cable.

The first connector includes a first connector plug or receptacle configured to mate with a corresponding receptacle or plug of a first device, wherein the first connector plug or receptacle includes a first set of electrical contacts configured to send and/or receive the data signals and/or power signals to and/or from the first device; a first metallic shell defining a first enclosure and including first and second openings, wherein the cable extends from inside to outside of the first enclosure via the second opening; and a first metallic cover attached to the first metallic shell to cover a portion of the first opening, wherein the first metallic cover includes a first window through which the first connector plug or receptacle extends from inside to outside of the first enclosure.

The second connector includes a second connector plug or receptacle configured to mate with a corresponding receptacle or plug of a second device, wherein the second connector plug or receptacle includes a second set of electrical contacts configured to send and/or receive the data signals and/or power signals to and/or from the second device; a second metallic shell defining a second enclosure and including third and fourth openings, wherein the cable extends from inside to outside of the second enclosure via the fourth opening; and a second metallic cover attached to the second metallic shell to cover a portion of the third opening, wherein the second metallic cover includes a second window through which the second connector plug or receptacle extends from inside to outside of the second enclosure.

Another aspect of the disclosure relates to a data communication cable assembly including a cable with a set of one or more communication mediums for transmitting one or more data signals and/or one or more power signals; and at least one connector attached to an end of the cable. The at least one connector including a connector plug or receptacle configured to mate with a corresponding receptacle or plug of a device, wherein the connector plug or receptacle includes a set of electrical contacts configured to send and/or receive the data signals and/or power signals to and/or from the device; and a metallic shell defining an enclosure and including first and second openings, wherein the cable extends from inside to outside of the enclosure via the second opening; a metallic cover attached to the metallic shell to cover a portion of the first opening, wherein the metallic cover includes a window through which the connector plug or receptacle mates with the corresponding receptacle or plug of the device.

Another aspect of the disclosure includes a data communication cable assembly including a cable with a set of one or more communication mediums for transmitting one or more data signals and/or one or more power signals; and at least one connector attached to an end of the cable. The connector includes a connector plug or receptacle configured to mate with a corresponding receptacle or plug of a device, wherein the connector plug or receptacle includes a set of electrical contacts configured to send and/or receive the data signals and/or power signals to and/or from the device; and a metallic shell defining an enclosure and including first and second openings, wherein the connector plug or receptacle mate is configured to mate with the corresponding receptacle or plug of the device via the first opening, and wherein the cable extends from inside to outside of the enclosure via the second opening.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

BRIEF DESCRIPTION OF THE DRAWINGS

FIGS. 2A-2B illustrate top and side views of another exemplary data communication cable assembly in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
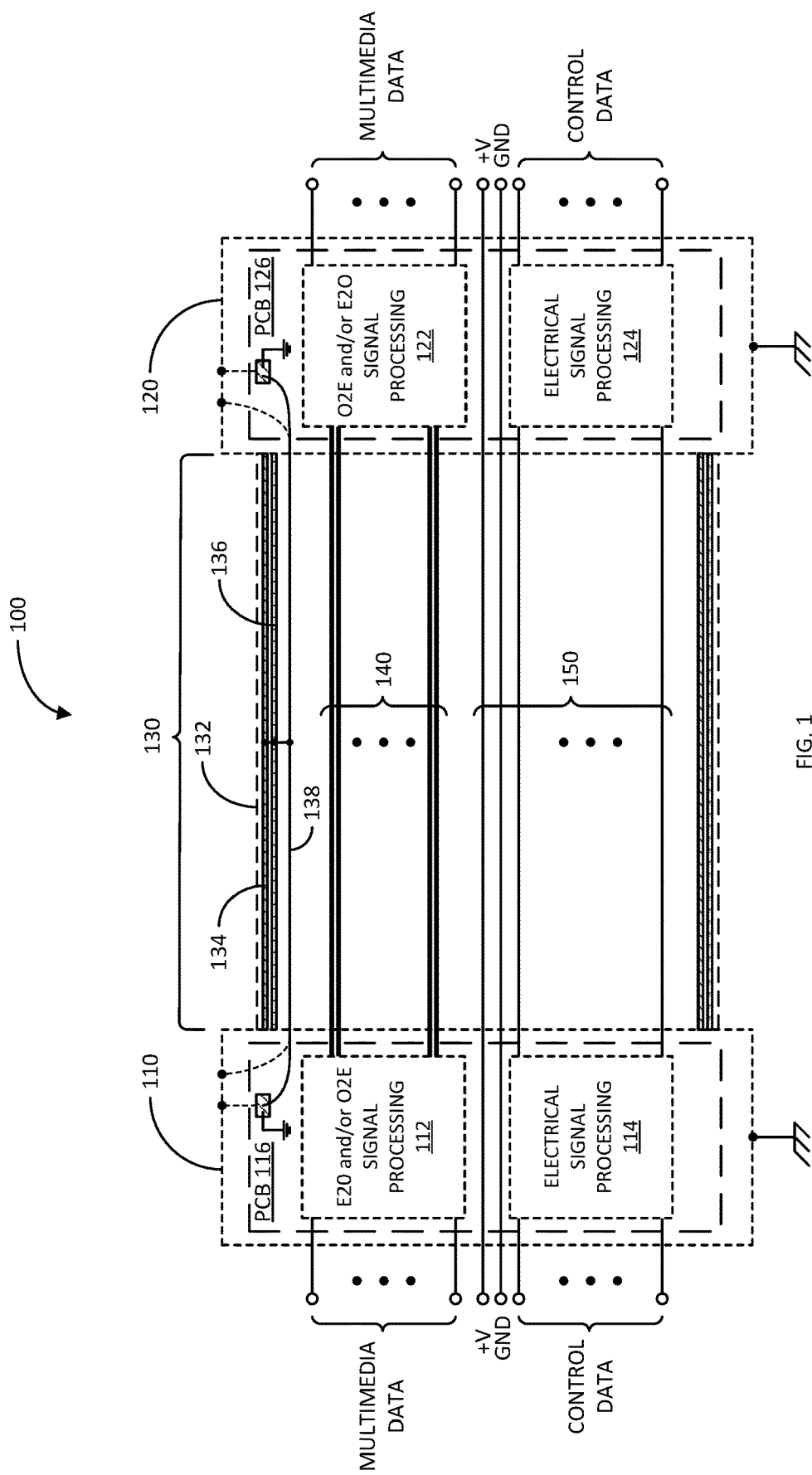
FIG. 1 illustrates a block/schematic diagram of an exemplary data communication cable assembly in accordance with an aspect of the disclosure.

FIG. 1 illustrates a block/schematic diagram of an exemplary data communication cable assembly 100 in accordance with an aspect of the disclosure. In summary, the data communication cable assembly 100 includes features to reduce electromagnetic leakage from the cable assembly so that it may be compliant with electromagnetic leakage requirement set by a standard.

Such features include: (1) an inner coaxial metallic cable layer (e.g., an aluminum sheet or aluminum-mylar sheet) coaxially surrounding at least the wire communication mediums of a cable; (2) an outer coaxial metallic cable layer (e.g., a copper braid) coaxially surrounding the inner coaxial metallic layer of the cable; (3) an electrical-conductor (referred to herein as a "drain") extending throughout the length of the cable, and including ends electrically-connected to chassis ground and/or signal ground on printed circuit boards (PCBs) situated within opposing connectors of the cable assembly, respectively; (4) a first electrically-conductive filler (e.g., a conductive elastomer or O-ring) substantially covering an interface or gap between a metallic shell and a metallic cover of each connector of the cable assembly; (5) and a second electrically-conductive filler (e.g., a conductive elastomer or O-ring) substantially covering an interface or gap between a cable attachment frame and the metallic shell of each connector of the cable assembly.

In particular, the data communication cable assembly 100 includes a first connector 110, a second connector 120, and a cable 130 including opposite ends attached to the first and second connectors 110 and 120, respectively. The first connector 110 is configured to mate with a corresponding connector of a first device (not shown). The second connector 120 is configured to mate with a corresponding connector of a second device (not shown). The cable 130 includes communication mediums for transmitting data signals and/or power signals between the first and second devices.

The first connector 110 includes electrical contacts (e.g., pins and/or sockets) for electrically mating with corresponding electrical contacts (e.g., sockets and/or pins) of the first device. Some of the electrical contacts may be for providing and/or receiving multimedia data (e.g., video and/or audio data) signals to and/or from the first device. Other electrical contacts may be for providing and/or receiving power signals (e.g., +V and ground (GND)) to and/or from the first device. Still other electrical contacts may be for providing and/or receiving control data signals to and/or from the first device.

As an example, if the data communication cable assembly 100 is configured in accordance with High-Definition Multimedia Interface (HDMI) protocol, the multimedia data electrical contacts may be pins 1-12 for receiving Transition Minimized Differential Signaling (TMDS) data signals, data shields, clocks, and clock shields from the first device as an HDMI source. The power contacts may be pins 17 and 18 for providing and/or receiving ground and +5V to and/or from the HDMI source. The control data may be pins 13-16 and 19 for providing and/or receiving Consumer Electronics Control (CEC) data, optional HDMI Ethernet channel or Audio Return Channel, Display Data Channel (DDC) clock (SCL), DDC data (SDA), and Hot Plug Detect with optical HDMI Ethernet Channel and Audio Return Channel to and/or from the HDMI source, respectively.

As another example, if the data communication cable 100 is configured in accordance with DisplayPort protocol, the multimedia data electrical contacts may be pins 1-12 for receiving multimedia channel data signals (positive, negative, and grounds) from the first device as a DisplayPort source. The power contacts may be pins 19 and 20 for providing and/or receiving power return and +3.3V to and from the DisplayPort source. The control data may be pins 15-18 for receiving and/or providing Auxiliary (AUX) channel related control signaling, (data positive/negative and ground) and Hot Plug Detect to and/or from the DisplayPort source, respectively.

The above HDMI and DisplayPort compliant cables are merely a couple of examples, but it shall be understood that the electromagnetic shielding techniques described herein may be applied to other data communication cables, including Digital Visual Interface (DVI) cable, Universal Serial Bus (USB) cable, and Quad Small Form-factor Pluggable (QSFP) cable. The multimedia and control data are merely examples; and may alternatively be or include other types of data.

The first connector 110 may include electrical-to-optical (E2O) and/or optical-to-electrical (O2E) signal processing circuitry 112 for converting the multimedia data electrical signal into multimedia data optical signal and/or multimedia data optical signal into multimedia data electrical signal. In other words, the data communication cable assembly 100 may be configured for unidirectional optical signal transmission or bidirectional optical signal transmission.

With regard to E2O signal processing, such circuitry 112 may include one or more drivers for conditioning the multimedia electrical data signal received from the first device for driving one or more lasers, and the one or more lasers for generating the multimedia data optical signals. The E2O signal processing circuitry 112 may further include one or more multiplexers for multiplexing two or more of the multimedia data electrical signal to generate a multiplexed data electrical signal for driving each laser.

With regard to O2E signal processing, such circuitry may include one or more photodiodes for converting the multimedia optical data signal into multimedia data electrical signal, and one or more signal conditioning circuits for conditioning the multimedia data electrical signal for compliant reception by the first device. The O2E circuitry 112 may further include one or more demultiplexers for demultiplexing each multiplexed multimedia data electrical signal into separate multimedia data electrical signals.

Additionally, the first connector 110 may include electrical signal processing circuitry 114 for performing signal processing on the control data electrical signal provided to and/or received from the first device. Such circuitry 114 may include signal conditioning for compensating the control data electrical signal received via the cable 130 for adverse effects (e.g., distortion) caused by transmission via the wire communication medium of the cable 130 prior to providing the control data electrical signal to the first device. Such signal conditioning may include amplifying, buffering and/or equalizing the control data electrical signal.

The circuitry 114 may also include signal conditioning for compensating the control data signal received from the first device for adverse effects (e.g., distortion) to be caused by transmission via the wire communication medium of the cable 130 prior to sending the control data electrical signal across the cable 130 to the second connector 120. Such signal conditioning may include amplifying and/or pre-emphasizing (e.g., modifying or sharpening the data transitions of) the control data signal.

The E2O and/or O2E signal processing circuitry 112 and the electrical signal processing circuitry 114 may be formed at least partially on a printed circuit board (PCB) 116. As depicted, the PCB 116 may include a signal ground pad and related traces as represented by the illustrated ground pad. Additionally, the housing or shell of the connector 110 may be connected to chassis ground.

The second connector 120 includes electrical contacts (e.g., pins and/or sockets) for electrically mating with corresponding electrical contacts (e.g., sockets and/or pins) of the second device. Some of the electrical contacts may be for providing and/or receiving multimedia data (e.g., video and/or audio data) signals to and/or from the second device. Other electrical contacts may be for providing and/or receiving power signals (e.g., +V and ground (GND)) to and/or from the second device. Still other electrical contacts may be for providing and/or receiving control data signals to and/or from the second device.

The second connector 120 may be compliant with any of a number of protocols, as discussed with reference to the first connector 110. That is, the second connector 120 may be compliant with HDMI, DisplayPort, DVI, QSFP, USB, and others.

The second connector 120 may include O2E and/or E2O signal processing circuitry 122 for converting multimedia data optical signal into multimedia data electrical signal and/or multimedia data electrical signal into multimedia data optical signal.

With regard to O2E signal processing, such circuitry 122 may include one or more photodiodes for converting the multimedia optical data signal into multimedia data electrical signal, and one or more signal conditioning circuits for conditioning the multimedia data electrical signal for compliant reception by the second device. The O2E signal processing circuitry 122 may further include one or more demultiplexers for demultiplexing each multiplexed multimedia data electrical signal into separate multimedia data electrical signals.

With regard to E2O signal processing, such circuitry 122 may include one or more drivers for conditioning the multimedia electrical data signal received from the second device for driving one or more lasers, and the one or more lasers for generating the multimedia data optical signals. The E2O signal processing circuitry 122 may further include one or more multiplexers for multiplexing two or more of the multimedia data electrical signal to generate a multiplexed data electrical signal for driving each laser.

Additionally, the second connector 120 may include electrical signal processing circuitry 124 for performing signal processing on the control data electrical signal provided to and/or received from the second device. Such circuitry 124 may include signal conditioning for compensating the control data electrical signal received via the cable 130 for adverse effects (e.g., distortion) caused by transmission via the wire communication medium of the cable 130 prior to providing the control data signal to the second device. Such signal conditioning may include amplifying, buffering and/or equalizing the control data electrical signal.

The circuitry 124 may also include signal conditioning for compensating the control data signal received from the second device for adverse effects (e.g., distortion) to be caused by transmission via the wire communication medium of the cable 130 prior to sending the control data signal across the cable 130 to the first connector 110. Such signal conditioning may include amplifying and/or pre-emphasizing (e.g., modifying or sharpening the data transitions of) the control data electrical signal.

The O2E and/or E2O signal processing circuitry 122 and the electrical signal processing circuitry 124 may be formed on a PCB 126. As depicted, the PCB 126 may include a signal ground pad and related traces as represented by the illustrated ground pad. Additionally, the housing or shell of the connector 120 may be connected to chassis ground.

The cable 130 includes a set of one or more optical fibers 140 for transmitting the multimedia data optical signals from the first connector 110 to the second connector 120, or in both directions. Additionally, the cable 130 further includes a set of one or more electrical wires (e.g., copper wires) for transmitting control data and/or power signals from the first connector 110 to the second connector 120, from the second connector 120 to the first connector 110, or in both directions.

To effectuate the electromagnetic shielding as previously discussed, the cable 130 further includes an inner electrically-conductive foil or sheet 136 (e.g., an aluminum-mylar sheet) coaxially surrounding at least the one or more wire communication mediums 150 and optionally the one or more optical fibers 140 throughout the length of the cable 130. Because the wire communication mediums 150 emit electromagnetic energy, the electrically-conductive foil or sheet 136, being coaxially surrounding the wires, prevents or reduces electromagnetic leakage out of the cable 130.

To provide additional electromagnetic shielding, the cable 130 further includes an outer electrically-conductive braid 134 (e.g., a copper braid) coaxially surrounding the inner electrically-conductive foil or sheet 136 throughout the length of the cable 130. Further, the cable 130 may optionally include an electrical-conductor (referred to herein as a "drain") that is electrically coupled to the electromagnetic shielding layers 134 and 136, and extending throughout the length of the cable 130 with opposite ends electrically attached to chassis and/or signal ground at connectors 110 and 120, respectively. That is, at each connector, the drain may be: (1) attached to the connector housing for chassis grounding, (2) attached to the ground pad on the PCB for signal grounding, or (3) attached to the connector housing or the PCB ground pad, and the connector housing being electrically connected to the ground pad on the PCB, for both chassis and signal grounding. The grounding of the electromagnetic shielding layers 134 and 136 via the drain wire 138 and the ground pads of the PCBs 116 and 126 improves the electromagnetic shielding of the electrically-conductive shielding layers 134 and 136.

The cable 130 further includes an electrically-insulating jacket 132 coaxially surrounding the outer and inner shielding layers 134 and 136 and the optical fiber and wire communication mediums 140 and 150. The jacket 132 extends substantially the entire length of the cable 130. The aforementioned data communication cable assembly 100 is discussed below with reference to several exemplary physical implementations.

FIGS. 2A-2B illustrate top and side views of another exemplary data communication cable assembly 200 in accordance with another aspect of the disclosure. The data communication cable assembly 200 may be an exemplary physical implementation of the data communication cable assembly 100 previously discussed.

The data communication cable assembly 200 includes a first connector 210, a second connector 230, and a cable 250 including opposite ends attached to the first and second connectors 210 and 230, respectively. At the first connector end, the data communication cable assembly 200 includes a stress relief boot 252 coaxially surrounding the cable 250 adjacent and attached to the first connector 210. Similarly, at the second connector end, the data communication cable assembly 200 includes a stress relief boot 254 coaxially surrounding the cable 250 adjacent and attached to the second connector 230. The stress relief boots 252 and 254 prevent damage to the cable 250 during handling and bending of the cable.

The first connector 210 includes a connector plug 212 mechanically coupled to a printed circuit board (PCB) 222, which, in turn, is mechanically coupled to a metallic (e.g., aluminum-alloy) cable attachment frame 224. The connector plug 212 is configured to mate with a corresponding connector receptacle of a first device (e.g., an HDMI source). The connector plug 212 includes a set of electrical contacts 214 electrically coupled to circuitry implemented in the PCB 222. The PCB circuitry is configured to effectuate the E2O and/or O2E signal processing 112 and the electrical signal processing 114 discussed with reference to data communication cable assembly 100. It shall be understood that the connector plug 212 may be configured as a receptacle for mating with a corresponding plug of the first device.

The metallic cable attachment frame 224 includes a bore configured to coaxially and securely receive (e.g., in a friction fit manner) an end of the cable 250. As in data communication cable assembly 100, the cable 250 includes a set of one or more communication mediums, such as a subset of one or more optical fibers and a subset of one or more wires (e.g., copper wires). The subset of one or more optical fibers are optically coupled to E2O and/or O2E signal processing circuitry implemented in the PCB 222. The subset of one or more wires are electrically coupled to electrical signal processing circuitry implemented in the PCB 222.

To enclose the PCB 222, the cable attachment frame 224, and the portion of the connector plug 212 attached to the PCB 222, the first connector 210 includes a metallic shell 216 and a metallic cover 218. The metallic shell 216 encloses the PCB 222, the cable attachment frame 224, and the portion of the connector plug 212 that attaches to the PCB 222. The metallic cover 218 securely covers an opening of the metallic shell 216, but includes a window or thru-hole through which the connector plug 212 extends from inside to outside of the enclosure. The metallic cover 218 further includes a set of friction guides 220 extending from the cover portion into the enclosure, and are configured to frictionally attached to the interior surface of the metallic shell 216.

Both the metallic cover 218 and the metallic shell 216 are each made from a single piece of metal (e.g., an aluminum alloy) to better provide electromagnetic shielding. Additionally, the first connector 210 may optionally include an electrically-conductive filler material (e.g., an electrically-conductive elastomer or O-ring) 226 coaxially disposed around the set of friction guides 220 and covering substantially an entire interface or gap between the metallic cover 218 and the metallic shell 216 to prevent or reduce electromagnetic leakage out of the enclosure. The electrically-conductive filler material 218 makes contact to the interior surfaces of the metallic cover 218 and the metallic shell 216.

The metallic shell 216 also includes a thru-hole that is substantially coaxial with the bore of the cable attachment frame 224. The cable 250 extends through the thru-hole of the metallic shell 216 and into the bore of the cable attachment frame 224. The communication mediums (e.g., one or more optical fibers and/or one or more electrical wires) of the cable 250 extend out of the cable 250 and are optically and electrically coupled to the PCB 222. As illustrated, the cable 250 may optionally include an electrically-conductive drain electrically coupled to a signal ground pad on the PCB 222, a chassis ground plane, or both ground planes if the signal ground pad is electrically coupled to the chassis ground, as previously discussed in detail with reference to data communication cable assembly 100.

To prevent or reduce electromagnetic leakage via the thru-hole of the metallic shell 216, the connector 210 may optionally include another electrically-conductive filler 228 (e.g., an electrically-conductive elastomer or O-ring) substantially covering an interface or gap between the cable attachment frame 224 and the metallic shell 216. More specifically, the electrically-conductive filler 228 is coaxially around the outer surface of the bore of the cable attachment frame 224 and adjacent to an interior surface of the metallic shell 216. Thus, the electrically-conductive filler 228 substantially covers an interface or gap between the cable attachment frame 224 and the metallic shell 216 to prevent electromagnetic leakage from the enclosure.

As discussed with reference to data communication cable assembly 100, the cable 250 includes a metal braid and metal foil coaxially surrounding the communication mediums of the cable 250 along substantially the entire length of the cable. Also, as discussed, the optional electrically-conductive drain is electrically attached to the metal braid and metal foil and to the signal and/or chassis ground, as discussed. Thus, the metal braid and metal foil are grounded. Thus, in this configuration, the data communication cable assembly 100 provides sufficient electromagnetic shielding to comply with requirements of certain standards or protocols.

The second connector 230 may be configured similar to the first connector 210 to provide electromagnetic shielding as described. The second connector 230 includes a connector plug 232 mechanically coupled to a PCB 242, which, in turn, is mechanically coupled to a metallic (e.g., aluminum-alloy) cable attachment frame 244. The connector plug 232 is configured to mate with a corresponding connector receptacle of a second device (e.g., an HDMI sink). The connector plug 232 includes a set of electrical contacts 234 electrically coupled to circuitry implemented in the PCB 242. The PCB circuitry is configured to effectuate the O2E and/or E2O signal processing 122 and electrical signal processing 124 discussed with reference to data communication cable assembly 100. It shall be understood that the connector plug 232 may be configured as a receptacle for mating with a corresponding plug of the first device.

The metallic cable attachment frame 244 includes a bore configured to coaxially and securely receive (e.g., in a friction fit manner) the other end of the cable 250. The subset of one or more optical fibers are optically coupled to O2E and/or E2O signal processing circuitry implemented in the PCB 242. The subset of one or more wires are electrically coupled to electrical signal processing circuitry implemented in the PCB 242.

To enclose the PCB 242, the cable attachment frame 244, and the portion of the connector plug 232 attached to the PCB 242, the second connector 230 includes a metallic shell 236 and a metallic cover 238. The metallic shell 236 encloses the PCB 242, the cable attachment frame 244, and the portion of the connector plug 232 that attaches to the PCB 242. The metallic cover 218 securely covers an opening of the metallic shell 236, but includes a window or thru-hole through which the connector plug 232 extends from inside to outside of the enclosure. The metallic cover 238 further includes a set of friction guides 240 extending from the internal side of the cover into the enclosure, and are configured to frictionally attached to the interior surface of the metallic shell 236.

Both the metallic cover 238 and the metallic shell 236 are each made from a single piece of metal (e.g., aluminum-alloy) to better provide electromagnetic shielding. Additionally, the second connector 230 may optionally include an electrically-conductive filler material (e.g., an electrically-conductive elastomer or O-ring) 246 coaxially disposed around the set of friction guides 240 and covering substantially an entire interface or gap between the metallic cover 238 and the metallic shell 236 to prevent or reduce electromagnetic leakage out of the enclosure. The electrically-conductive filler material 246 makes contact to the interior surfaces of the metallic cover 238 and the metallic shell 236.

The metallic shell 236 also includes a thru-hole through which the bore of the cable attachment frame 244 extends. The cable 250 extends through the thru-hole of the metallic shell 236 and into the bore of the cable attachment frame 244. The communication mediums (e.g., one or more optical fibers and/or one or more electrical wires) of the cable 250 extend out of the cable and are optically and electrically coupled to the PCB 242. As illustrated, the optional electrically-conductive drain of the cable 250 is electrically coupled to a signal ground pad on the PCB 242, a chassis ground plane, or both ground planes if the signal ground pad is electrically coupled to the chassis ground, as previously discussed in detail with reference to data communication cable assembly 100.

To prevent or reduce electromagnetic leakage via the thru-hole of the metallic shell 236, the connector 230 may optionally include another electrically-conductive filler 248 (e.g., an electrically-conductive elastomer or O-ring) substantially covers an interface or gap between the cable attachment frame 244 and the metallic shell 236. More specifically, the electrically-conductive filler 248 is coaxially around the outer surface of the bore of the cable attachment frame 244 and adjacent to an interior surface of the metallic shell 236. Thus, the electrically-conductive filler 248 substantially covers an interface or gap between the cable attachment frame 244 and the metallic shell 236 to prevent electromagnetic leakage from the enclosure.

Figure 3:
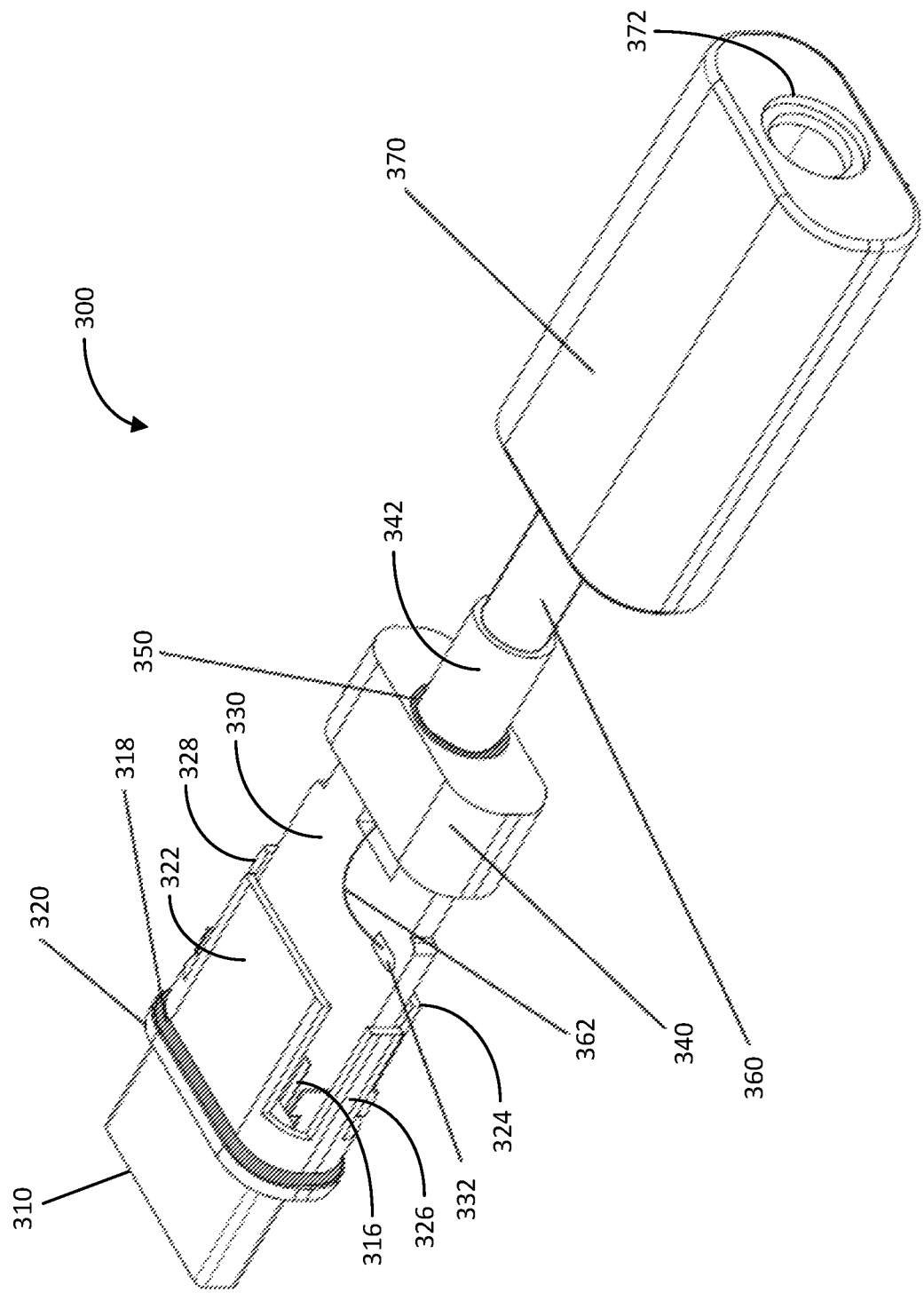
FIG. 3 illustrates a perspective view of an exemplary partially-disassembled connector of a data communication cable assembly in accordance with another aspect of the disclosure.

FIG. 3 illustrates a perspective view of an exemplary partially-disassembled connector 300 in accordance with another aspect of the disclosure. The exemplary connector 300 may be an exemplary detailed physical implementation of any of the connectors 110, 120, 210, or 230 previously discussed. In this example, the metallic shell is separated from the metallic cover to better illustrate the internal components of the connector 300.

The connector 300 includes a connector plug 310 configured to mate with a corresponding connector of a device (e.g., an HDMI source or sink). The connector plug 310 is mechanically connected to a PCB 330. The PCB 330 is mechanically connected to a cable attachment frame 340. The connector plug 310 includes a set of electrical contacts 316 electrically coupled to the PCB 330.

The cable attachment frame 340 includes a bore 342 extending in the cable longitudinal direction away from the main body of the cable attachment frame 340. The bore 342 is configured to securely receive a cable 360 in a friction fit manner. As previous discussed, the cable 360 includes a set of communication mediums (not shown in FIG. 3), as well as an optional electrically-conductive drain 362, and shielding layers (e.g., metal foil and metal braid, not shown in FIG. 3). As illustrated, the optional electrically-conductive drain 362 may be electrically coupled to a signal ground pad 332 on the PCB 330, chassis ground, or both signal and chassis grounds as discussed.

The connector 300 further includes a metallic cover 320 with upper, lower, and side friction guides 322, 324, 326, and 328 extending in the cable longitudinal direction away from the connector plug 310. Additionally, the connector 300 includes a metallic shell 370 with a side configured to mate with the metallic cover 320. To provide electromagnetic shielding at the plug end of the connector 300, the connector 300 includes an optional electrically-conductive filler 318 (e.g., elastomer or O-ring) substantially covering the entire interface between the metallic cover 320 and the metallic shell 370. The metallic shell 370 includes an opening 372 through which the cable 360 extends into the cable attachment frame 340.

To effectuate electromagnetic shielding at the cable side of the connector 300, the connector includes an optional electrically-conductive filler 350 (e.g., an electrically-conductive elastomer or O-ring) coaxially surrounding the exterior surface of the bore 342 adjacent to the main body of the cable attachment frame 340. The electrically-conductive filler 350 is sandwiched between a narrower and inner step of the opening 372 of the metallic shell 372 and the exterior surface of the bore 342. Thus, in this configuration, the electrically-conductive filler 350 covers substantially the entire the interface between the cable attachment frame 340 and the metallic shell 370 to prevent or reduce electromagnetic leakage through the interface. The wider and outer step of the opening 372 is configured to be flushed with a perimeter end of the corresponding stress relief boot (not shown in FIG. 3).

Figure 4:
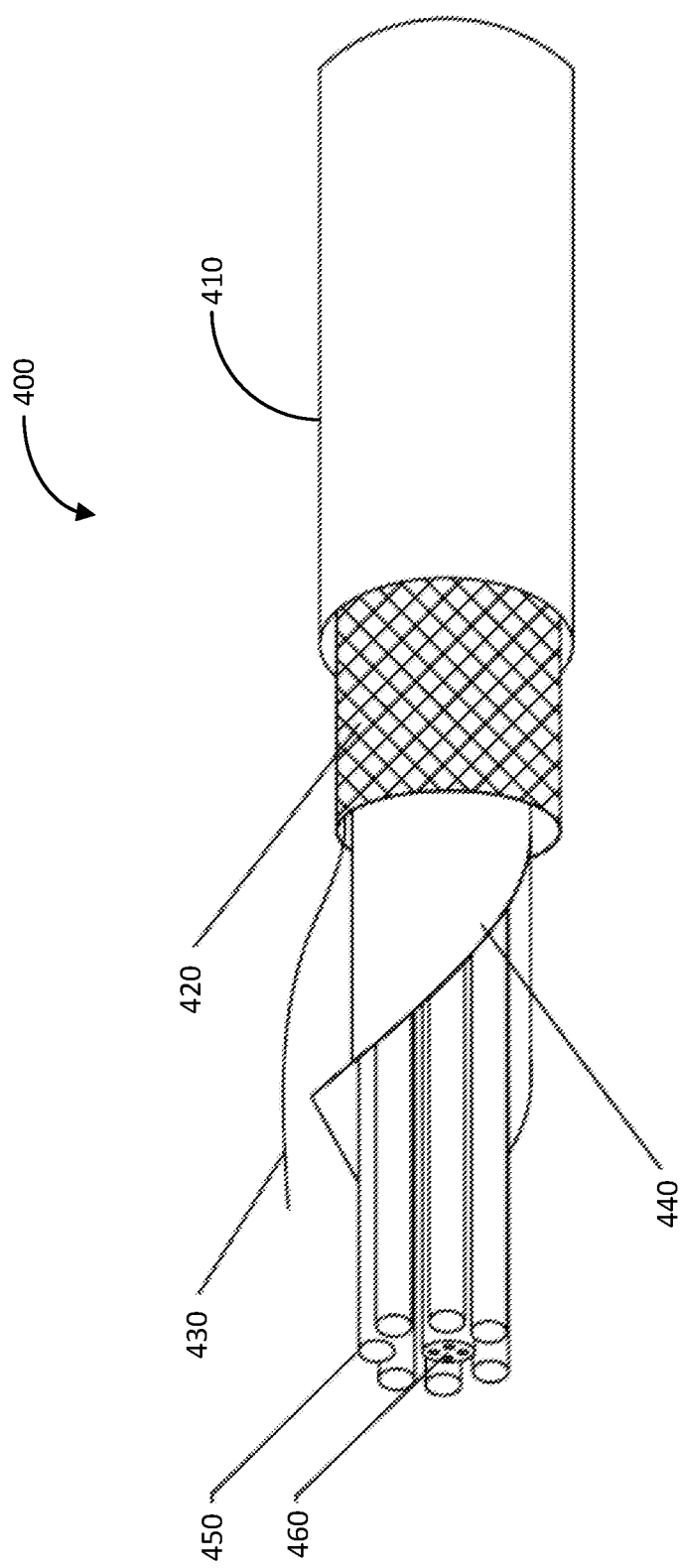
FIG. 4 illustrates a side view of an exemplary cable of a data communication cable assembly in accordance with another aspect of the disclosure.

FIG. 4 illustrates a side view of an exemplary cable 400 in accordance with another aspect of the disclosure. The cable 400 may be a detailed implementation of any of the cables described herein.

The cable 400 includes a set of communication mediums, such as a subset of one or more insulated wires (e.g., copper wires) 450 and a subset of one or more optical fibers 460, both extending along the entire length of the cable. In this example, the subset of optical fibers 460 are situated centrally within the cable 400, with the subset of insulated wires 450 surrounding the set of optical fibers. It shall be understood that the subset of one or more wires 450 and the subset of one or more optical fibers 460 may be arranged in many different manners within the cable 400.

The cable 400 includes a metallic foil 440 (e.g., an aluminum-mylar foil) coaxially surrounding the communication mediums 450 and 460 along substantially the entire length of the cable. Additionally, the cable 400 further includes a metallic braid 420 coaxially surrounding the metallic foil 440 along substantially the entire length of the cable. Further, the cable 400 includes an optional electrical-conductor 430 ("drain") extending substantially along the entire length of the cable. The electrical-conductive drain 430 is electrically coupled to the metallic foil 440 and the metallic braid 420. Also, as discussed with reference to the other exemplary cable implementations, the electrical-conductive drain 430 includes ends electrically attached to signal and/or chassis ground at both connectors of the cable 400, respectively. Accordingly, the electrical-conductive drain 430 provides ground potential to the metallic foil 440 and the metallic braid 420 to improve the electromagnetic shielding properties of the cable 400.

The cable 400 further includes an electrically-insulating jacket 410 coaxially surrounding the metallic braid 420 along substantially the entire length of the cable. It shall be understood that the cable 400 may be configured differently. For example, the cable 400 need not include the metallic braid 420, but may include the metallic foil 440. Alternatively, the cable 400 need not include the metallic foil 440, but may include the metallic braid 420. The electrical-conductive drain 430 may be situated between the jacket 410 and the metallic braid 420, or between the metallic braid 420 and the metallic foil 440, or coaxially surrounded by the metallic foil 440.

Figure 5:
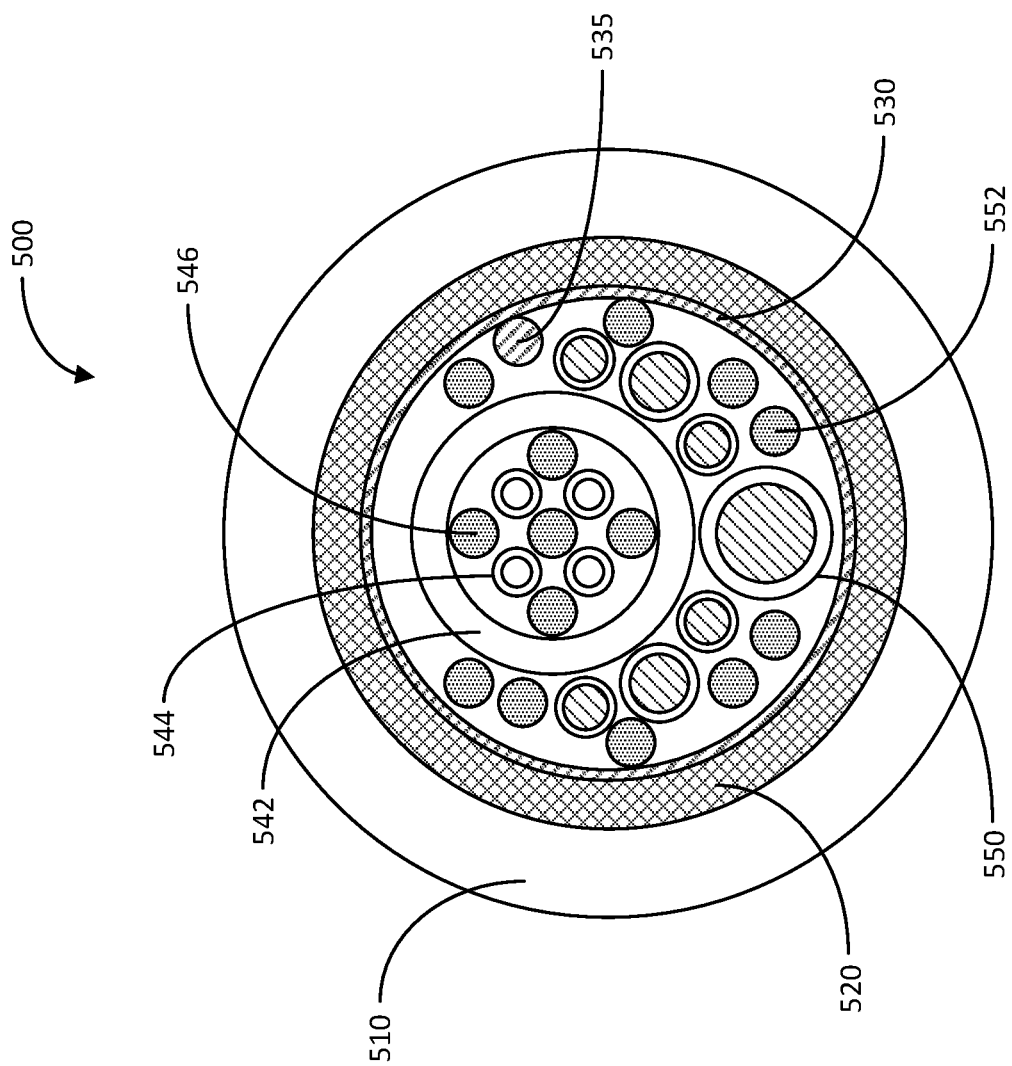
FIG. 5 illustrates a cross-sectional view of another exemplary cable of a data communication cable assembly in accordance with another aspect of the disclosure.

FIG. 5 illustrates a cross-sectional view of another exemplary cable 500 in accordance with another aspect of the disclosure. The cable 500 may be a detailed implementation of any of the cables described herein.

The cable 500 includes a set of one or more optical fibers 544 (e.g., four (4)) extending longitudinally along substantially an entire length of the cable. The cable 500 further includes an internal (e.g., electrically-insulating) jacket 542 extending longitudinally along substantially the entire length of the cable, and coaxially surrounding the set of one or more optical fibers 544. The cable 500 may further include a set of one or more elongated (e.g., electrically-insulating) fillers 546 extending longitudinally along substantially the entire length of the cable, and also being surrounded by the internal jacket 542. The set of one or more fillers 546 reduces movement by the optical fibers 544 during cable handling to reduce the likelihood of damage to the optical fibers.

The cable 500 further includes a set of one or more electrically-insulated (e.g., coated) copper wires 550 (e.g., seven (7)), which may be of the same or different gauges, and extend along substantially the entire length of the cable. In this example, the set of one or more insulated wires 550 are situated outside of the internal jacket 542 of the set of the one or more optical fibers 544. Similarly, the cable 500 also includes a set of one or more elongated (e.g., electrically-insulating) fillers 552 extending longitudinally along substantially the entire length of the cable. The set of one or more fillers 552 reduces movement by the wires 550 during cable handling to reduce the likelihood of damage to the wires 550.

Additionally, the cable 500 includes a metallic (e.g., aluminum-mylar) foil 530 coaxially surrounding the optical fibers 544, fillers 546 for the optical fibers, internal jacket 542, wires 550, and fillers 552 for the wires. Similarly, the metallic foil 530 extends longitudinally along substantially the entire length of the cable. The metallic foil 530 may also coaxially surround an optional electrical-conductor ("drain") 535 extending longitudinally along substantially the entire length of the cable, and which may be grounded at both ends of the cable by being electrically attached to grounded conductors at the opposing connectors, respectively. As illustrated, the electrically-conductive drain 535 is electrically coupled to the metallic foil 530.

Further, the cable 500 includes a metallic (e.g., copper) braid 520 coaxially surrounding and electrically coupled to the metallic foil 530, and extending longitudinally along substantially the entire length of the cable. As the metallic braid 520 is electrically coupled to the metallic foil 530, and the metallic foil 530 is electrically coupled to the drain, both coaxial layers 520 and 530 are at substantially ground potential to improve the electromagnetic shielding properties of the cable. The cable 500 further includes an electrical-insulating jacket 510 coaxially surrounding the metallic braid 520, and extending longitudinally along the entire length of the cable.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A data communication cable assembly, comprising:
    a cable including a set of one or more communication mediums for transmitting one or more data signals and/or one or more power signals;
    a first connector, attached to a first end of the cable, comprising:
        a first connector plug or receptacle configured to mate with a corresponding receptacle or plug of a first device, wherein the first connector plug or receptacle includes a first set of electrical contacts configured to send and/or receive the data signals and/or power signals to and/or from the first device;
        a first metallic shell defining a first enclosure and including first and second openings, wherein the cable extends from inside to outside of the first enclosure via the second opening; and
        a first metallic cover attached to the first metallic shell to cover a portion of the first opening, wherein the first metallic cover includes a first window through which the first connector plug or receptacle extends from inside to outside of the first enclosure, wherein the first metallic cover includes a first set of one or more friction guides frictionally attached to an interior surface of the first metallic shell to effectuate a secure attachment of the first metallic cover to the first metallic shell; and
    a second connector, attached to a second end of the cable, comprising:
        a second connector plug or receptacle configured to mate with a corresponding receptacle or plug of a second device, wherein the second connector plug or receptacle includes a second set of electrical contacts configured to send and/or receive the data signals and/or power signals to and/or from the second device;
        a second metallic shell defining a second enclosure and including third and fourth openings, wherein the cable extends from inside to outside of the second enclosure via the fourth opening; and
        a second metallic cover attached to the second metallic shell to cover a portion of the third opening, wherein the second metallic cover includes a second window through which the second connector plug or receptacle extends from inside to outside of the second enclosure, and wherein the second metallic cover includes a second set of one or more friction guides frictionally attached to an interior surface of the second metallic shell to effectuate a secure attachment of the second metallic cover to the second metallic shell.

2. The data communication cable assembly of claim 1, further comprising an electrically-conductive filler material substantially covering an interface between the first metallic shell and the first metallic cover.

3. The data communication cable assembly of claim 2, wherein the electrically-conductive filler comprises an electrically-conductive elastomer or O-ring.

4. The data communication cable assembly of claim 1, further comprising an electrically-conductive filler material substantially covering an interface between the second metallic shell and the second metallic cover.

5. The data communication cable assembly of claim 1, wherein the first connector comprises a first cable attachment frame attached to the first end of the cable, wherein the first cable attachment frame is situated within the first enclosure; and
wherein the second connector comprises a second cable attachment frame attached to the second end of the cable, wherein the second cable attachment frame is situated within the second enclosure.

6. The data communication cable assembly of claim 5, wherein the first connector further comprises a first electrically-conductive filler substantially covering an interface between the first cable attachment frame and the first metallic shell; and
wherein the second connector further comprises a second electrically-conductive filler substantially covering an interface between the second cable attachment frame and the second metallic shell.

7. The data communication cable assembly of claim 6, wherein the first and/or second electrically-conductive filler comprise an electrically-conductive elastomer or O-ring.

8. The data communication cable assembly of claim 6, wherein the first cable attachment frame comprises a first bore through which the cable extends, wherein a third electrically-conductive filler is coaxially situated around an external surface of the first bore at the second opening of the first metallic shell; and
wherein the second cable attachment frame comprises a second bore through which the cable extends, wherein a fourth electrically-conductive filler is coaxially situated around an external surface of the second bore substantially at the fourth opening of the second metallic shell.

9. The data communication cable assembly of claim 1, wherein the set of one or more communication mediums comprises a set of one or more optical fibers, wherein the first connector includes a first printed circuit board (PCB) situated within the first enclosure, wherein the first PCB includes a first circuit for converting the one or more data signals from an electrical signal to an optical signal for transmission to the second connector via the set of one or more optical fibers.

10. The data communication cable assembly of claim 9, wherein the second connector includes a second PCB situated within the second enclosure, wherein the second PCB includes a second circuit for converting the one or more data signals from an optical signal to an electrical signal.

11. The data communication cable assembly of claim 1, wherein the set of one or more communication mediums comprises a set of one or more wires for transmission of the data signals between the first and second connectors, and wherein the cable further includes a first electrical conductor surrounding the set of one or more wires throughout substantially an entire length of the cable.

12. The data communication cable assembly of claim 11, wherein the first electrical conductor comprises a metallic foil or a metallic braid.

13. The data communication cable assembly of claim 11, wherein the cable further comprises a second electrical conductor surrounding the first electrical conductor throughout substantially the entire length of the cable.

14. The data communication cable assembly of claim 13, wherein the first electrical conductor comprises a metallic foil and the second electrical conductor comprises a metallic braid.

15. The data communication cable assembly of claim 11, wherein the first electrical conductor is electrically coupled to grounded structures at the first and second connectors, respectively.

16. The data communication cable assembly of claim 11, wherein the first connector comprises a first printed circuit board (PCB) including a first circuit configured to apply a first signal conditioning to the set of one or more data signals, wherein the first PCB includes a first grounded pad, and wherein the first PCB is situated within the first enclosure;
wherein the second connector comprises a second printed circuit board (PCB) including a second circuit configured to apply a second signal conditioning to the set of one or more data signals, wherein the second PCB includes a second grounded pad, and wherein the second PCB is situated within the second enclosure; and
wherein the first electrical conductor is electrically coupled to the first and second grounded pads.

17. The data communication cable assembly of claim 16, wherein the cable comprises a second electrical conductor electrically coupled to the first electrical conductor, wherein the second electrical conductor is attached to the first and second grounded pads.

18. The data communication cable assembly of claim 16, wherein the first and/or second signal conditioning compensates the one or more data signals for adverse effects caused or to be caused by transmission via the set of one or more wires.

19. The data communication cable assembly of claim 1, wherein the first connector further comprises:
a first cable attachment frame situated within the first enclosure and securely attached to the first end of the cable; and
a first printed circuit board (PCB) including a first circuit configured to apply a first signal processing on the one or more data signals, wherein the first PCB is situated within the first enclosure and mechanically coupled to the first connector plug and the first cable attachment frame; and
a second cable attachment frame situated within the second enclosure and securely attached to the second end of the cable; and
a second PCB including a second circuit configured to apply a second signal processing on the one or more data signals, wherein the second PCB is situated within the second enclosure and mechanically coupled to the second connector plug and the second cable attachment frame.

20. A data communication cable assembly, comprising:
a cable including a set of one or more communication mediums for transmitting one or more data signals and/or one or more power signals; and
at least one connector, attached to an end of the cable, comprising:
- a connector plug or receptacle configured to mate with a corresponding receptacle or plug of a device, wherein the connector plug or receptacle includes a set of electrical contacts configured to send and/or receive the data signals and/or power signals to and/or from the device;
- a metallic shell defining an enclosure and including first and second openings, wherein the cable extends from inside to outside of the enclosure via the second opening; and
- a metallic cover attached to the metallic shell to cover a portion of the first opening, wherein the metallic cover includes a window through which the connector plug or receptacle mates with the corresponding receptacle or plug of the device, and wherein the metallic cover includes a set of one or more friction guides frictionally attached to an interior surface of the metallic shell to effectuate a secure attachment of the first metallic cover to the first metallic shell.

21. A data communication cable assembly, comprising:
a cable including a set of one or more communication mediums for transmitting one or more data signals and/or one or more power signals;
a first connector, attached to a first end of the cable, comprising:
- a first connector plug or receptacle configured to mate with a corresponding receptacle or plug of a first device, wherein the first connector plug or receptacle includes a first set of electrical contacts configured to send and/or receive the data signals and/or power signals to and/or from the first device;
- a first metallic shell defining a first enclosure and including first and second openings, wherein the cable extends from inside to outside of the first enclosure via the second opening; and
- a first metallic cover attached to the first metallic shell to cover a portion of the first opening, wherein the first metallic cover includes a first window through which the first connector plug or receptacle extends from inside to outside of the first enclosure; and a second connector, attached to a second end of the cable, comprising:
- a second connector plug or receptacle configured to mate with a corresponding receptacle or plug of a second device, wherein the second connector plug or receptacle includes a second set of electrical contacts configured to send and/or receive the data signals and/or power signals to and/or from the second device;
- a second metallic shell defining a second enclosure and including third and fourth openings, wherein the cable extends from inside to outside of the second enclosure via the fourth opening; and
- a second metallic cover attached to the second metallic shell to cover a portion of the third opening, wherein the second metallic cover includes a second window through which the second connector plug or receptacle extends from inside to outside of the second enclosure;

wherein the set of one or more communication mediums comprises a set of one or more wires for transmission of the data signals between the first and second connectors, and wherein the cable further includes a first electrical conductor surrounding the set of one or more wires throughout substantially an entire length of the cable;

wherein the first connector comprises a first printed circuit board (PCB) including a first circuit configured to apply a first signal conditioning to the set of one or more data signals, wherein the first PCB includes a first grounded pad, and wherein the first PCB is situated within the first enclosure;

wherein the second connector comprises a second printed circuit board (PCB) including a second circuit configured to apply a second signal conditioning to the set of one or more data signals, wherein the second PCB includes a second grounded pad, and wherein the second PCB is situated within the second enclosure;

wherein the first electrical conductor is electrically coupled to the first and second grounded pads; and wherein the first and/or second signal conditioning compensates the one or more data signals for adverse effects caused or to be caused by transmission via the set of one or more wires over the specific length of the wires.

22. The data communication cable assembly of claim 21, wherein the set of one or more wires comprises a plurality of wires, and further comprising an electrically-conductive braid or foil coaxially surrounding the plurality of wires throughout a length of the cable, wherein the first electrical conductor is electrically coupled to the electrically-conductive braid or foil.

23. The data communication cable assembly of claim 21, wherein the set of one or more wires comprises a plurality of wires, and further comprising:
- an electrically-conductive foil coaxially surrounding the plurality of wires throughout a length of the cable; and
- an electrically-conductive braid coaxially surrounding the electrically-conductive foil throughout the length of the cable, wherein the first electrical conductor is electrically coupled to the electrically-conductive foil and the electrically-conductive braid.

* * * * *